(12) United States Patent
Graf

(10) Patent No.: US 7,493,231 B2
(45) Date of Patent: Feb. 17, 2009

(54) PROCESS FOR DETERMINING THE ACTUAL POSITION OF A ROTATION AXIS OF A TRANSPORTATION MECHANISM

(76) Inventor: Ottmar Graf, Ravensburger Strasse 38, Bergatreute, 88368 (DE)

( * ) Notice: Subject to any disclaimer, the term of this patent is extended or adjusted under 35 U.S.C. 154(b) by 0 days.

(21) Appl. No.: 11/491,477

(22) Filed: Jul. 21, 2006

(65) Prior Publication Data

US 2007/0150226 A1  Jun. 28, 2007

(30) Foreign Application Priority Data

Jul. 27, 2005  (DE) ........................ 10 2005 035 199

(51) Int. Cl.
  *G01C 9/00*  (2006.01)
  *G06F 19/00*  (2006.01)
(52) U.S. Cl. .................... 702/151; 33/1 R; 33/1 N; 33/1 PT; 33/501; 33/520; 33/568; 33/573; 73/1.01; 73/1.75; 73/1.79; 702/85; 702/92; 702/94; 702/150; 702/154; 702/189
(58) Field of Classification Search .............. 33/1 R, 33/1 N, 1 PT, 501, 520, 534, 568, 573; 73/1.01, 73/1.75, 1.79; 702/85, 92, 94, 105, 127, 702/150, 151, 154, 155, 157, 189
See application file for complete search history.

(56) References Cited

U.S. PATENT DOCUMENTS

| | | | | |
|---|---|---|---|---|
| 4,011,659 A | * | 3/1977 | Horvallius | 33/203 |
| 5,261,279 A | * | 11/1993 | Wolf et al. | 361/280 |
| 5,359,693 A | * | 10/1994 | Nenyei et al. | 392/418 |
| 5,580,830 A | * | 12/1996 | Nenyei et al. | 438/795 |
| 5,822,213 A | * | 10/1998 | Huynh | 700/213 |
| 5,825,913 A | * | 10/1998 | Rostami et al. | 382/151 |
| 6,038,524 A | * | 3/2000 | Leger et al. | 702/151 |

(Continued)

FOREIGN PATENT DOCUMENTS

WO   WO 0196836 A1   12/2001

(Continued)

OTHER PUBLICATIONS

International Search Report—3 pages, Dated Oct. 5, 2007.

(Continued)

*Primary Examiner*—Edward R Cosimano
(74) *Attorney, Agent, or Firm*—Dority & Manning, P.A.

(57) ABSTRACT

Determination of the actual position of the rotation axis of a transportation mechanism relative to a reference axis, in particular relative to gravity, is performed with at least one inclination sensor mounted to the transportation mechanism having at least one measurement axis, and comprises the measurement of the inclination of at least the one inclination sensor along the at least one measurement axis in a first rotation position of the transportation mechanism, and the measurement of the inclination of the at least one inclination sensor along the at least one measurement axis in a second rotation position. The actual position of the rotation axis of the transportation mechanism may be determined from the measurement values of the inclination sensor and the angular separation between the rotation positions. The process is suitable in particular for a process to align the rotation axis of a transportation mechanism and for a process for replacing a transportation mechanism.

26 Claims, 5 Drawing Sheets

U.S. PATENT DOCUMENTS

| | | | | |
|---|---|---|---|---|
| 6,162,008 | A * | 12/2000 | Perkins et al. | 414/754 |
| 6,400,445 | B2 * | 6/2002 | Nishi et al. | 355/72 |
| 6,526,364 | B2 * | 2/2003 | Omori et al. | 702/95 |
| 6,529,852 | B2 | 3/2003 | Knoll et al. | |
| 6,763,281 | B2 * | 7/2004 | Schauer et al. | 700/218 |
| 7,113,271 | B2 * | 9/2006 | Loen | 356/152.1 |
| 2001/0008994 | A1 * | 7/2001 | Omori et al. | 702/95 |
| 2001/0016293 | A1 * | 8/2001 | Nishi et al. | 430/22 |
| 2003/0132397 | A1 | 7/2003 | Nam | |
| 2005/0041236 | A1 * | 2/2005 | Loen | 356/4.01 |
| 2005/0273202 | A1 | 12/2005 | Bischoff | |
| 2007/0150226 | A1 * | 6/2007 | Graf | 702/150 |

FOREIGN PATENT DOCUMENTS

WO      WO 2007/015975  A2 *   2/2007

OTHER PUBLICATIONS

The Written Opinion—4 pages, Dated Oct. 5, 2007.

* cited by examiner a)

b)

c)

PROCESS FOR DETERMINING THE ACTUAL POSITION OF A ROTATION AXIS OF A TRANSPORTATION MECHANISM

RELATED APPLICATION

The present application is based on and claims priority to German Patent Application No. 10 2005 035 199.9, filed Jul. 27, 2005.

BACKGROUND

The present invention regards a process for determining the actual position of a rotation axis of a transportation mechanism, in particular a wafer transportation mechanism with at least one rotation element, rotatable around a rotation axis and at least one transportation arm mounted to the rotation element. The invention furthermore regards a process for aligning a transportation mechanism through a determination process according to the invention.

During the manufacture of electronic components like memory chips, microprocessors, customer specific circuit designs, or logical components, a multitude of various semiconductor technology processes are being used. These processes have to be very well and precisely adjusted to each other and often have to allow the production of a multitude of components with reproducible properties per unit time. Scrap has to be avoided if possible. The process environment has to be free of particles, if possible, since particles quickly create scrap. Therefore semiconductor technology processes are typically performed in highest-grade clean rooms and the automation of the particular processes and of the steps between the processes in semiconductor production lines has reached a very high level.

For transportation between the various process stations, automated transportation mechanisms are provided, which for example among other things are being used for loading and unloading rapid heating systems which are being used for thermal treatment of substrates such as, e.g., semiconductor wafers. Rapid heating systems, also called RTP systems, are very well known in semiconductor production (U.S. Pat. No. 5,359,693 or U.S. Pat. No. 5,580,830). They are being used for thermal treatment of wafers consisting, for example, of silicon, but also of other semiconductor materials like Germanium, SiC, or other compound semiconductors like GaAs or InP. Such rapid heating systems must guarantee a yield of close to 100 percent. Therefore, the loading and unloading with the wafers to be processed is performed automatically by transportation mechanisms, which are also called wafer handlers. The wafer handlers have to be adjusted precisely relative to the systems they are serving in order to avoid possible damages to the material to be transported.

Transportation mechanisms in process equipment generally serve for transporting wafers or other semiconductor substrates from a wafer box into the process equipment and from the process equipment back into a wafer box. They typically have a rotation element rotatable around a rotation axis and at least one transport arm mounted to the rotation element. Often a lifting device is provided in order to allow transportation along the rotation axis. The transportation arm(s) also typically articulate in order to allow a lateral movement in addition to a rotation around the rotation axis. Therefore, a metal arm piece is typically mounted to one end of the rotation element and at its free end there is an additional metal arm piece, which is also rotatable around a second axis. While the rotation element is capable of performing rotations as well as up and down movements, the second rotation axis gener- ally is a simple rotation axis which serves for adjusting the angle between the two arm pieces and thereby the distance of the substrate to be processed from the central rotation axis. At the end of the second arm piece generally an end piece with a carrier surface is mounted, which is provided for carrying the substrate.

In a piece of semiconductor production equipment, like e.g. a RTP system, this end piece, for example, has to fetch wafers out of a wafer box, load at least one process chamber with wafers, pick the wafers up from the process chamber after the process, possibly move the wafers into a second process chamber (e.g. a cooling chamber), remove them again from there, and put them into another wafer box. The particular stations to be approached one after another mostly are located around the transportation mechanism so that they can be reached by it quickly. Since the transportation mechanism is typically mounted onto a system platform in a solid manner it has to perform rotations around its central rotation axis in many cases in order to reach all stations. Therefore, the location of the central rotation axis relative to a predetermined direction can not be determined directly in many cases, since the rotation element is mounted into a housing by the manufacturer of the transportation mechanism and therefore is mostly not accessible for a direct measurement of its direction. However, the manufacturers of transportation mechanisms always strive to mount the transportation mechanism into a housing in a manner that at least one housing surface is perpendicular to the central rotation axis of the transportation mechanism and thereby can serve to align the central axis with a certain direction. Reality, however, shows that due to a manufacturer's tolerances the rotation axis is often not aligned in a certain direction with sufficient precision when it is aligned based on the direction of a housing surface. The alignment thereby becomes more difficult.

So far it has been attempted to solve the alignment problem with very imprecise methods, mostly guided by subjective impressions. Thus, it was attempted, e.g., to adjust for a horizontal position of the substrate carrier surface in a certain rotation position of the transportation mechanism with the consequence that the carrier surface was badly aligned in another rotation position, mostly in the opposite direction. This frequently caused either faulty handling or even damage to the substrates. In order to minimize the occurrence of errors, then, whole stations had to be realigned.

Another solution is described in U.S. Pat. No. 6,763,281. According to this Patent the alignment problem is solved through aligning the end piece of the transportation mechanism, which carries the material to be transported, relative to the system to be served through a specially developed alignment device. The alignment device has a body defining an opening, wherein the opening is large enough so the material to be transported can be moved through it. On the body around the opening a multitude of sensors is mounted. The alignment device has to be mounted onto a platform with defined directions relative to the system to be served. Thereafter the end piece is moved through the opening in order to determine its position relative to the system to be served through the sensors. This is a very complicated manual process since the alignment device has to be precisely mounted before performing the procedure. Furthermore, if the transportation mechanism serves several stations, all further stations have to be aligned to the end piece, which can be complicated.

If cassette stations are being aligned to fit the transportation mechanism, the cassette stations may end up tilting towards the inside, and the wafers housed in the cassette stations could then fall out due to gravity and system vibrations. Such vibrations can, e.g., already be created through the motions of the transportation mechanism. The fallen out wafers can break and thereby cannot be used anymore. System shutdown times for removing the broken wafers would have to be taken into consideration.

On the other hand, if a transportation mechanism has to be replaced with a new transportation mechanism, e.g. because it has reached the end of its useful life, all stations to be served have to be realigned accordingly, since the direction of the central axis of the new transportation mechanism does not necessarily coincide with the original direction of the central axis of the transportation mechanism, which was replaced.

Therefore, it is the objective of the present invention to determine the axis of a transportation mechanism relative to a reference axis, in particular relative to earth gravity, in a simple and cost effective manner. This determination allows the alignment of the rotation axis in a desired position, in particular in alignment with earth gravity.

SUMMARY

The objective of the invention is accomplished with a process for determining the actual position of a rotation axis of a transportation mechanism relative to a reference axis, wherein the transportation mechanism has at least one rotable rotation element rotable around the rotation axis and at least one transportation arm mounted to the rotation element with at least one inclination sensor mounted to the transportation mechanism, having at least one measurement axis, wherein initially the inclination of the at least one inclination sensor along the at least one measuring axis is measured in a first rotation position of the transportation mechanism and the transportation mechanism is subsequently rotated around the rotation axis into a second rotation position and the inclination of the at least one inclination sensor is measured along the least one measurement axis in the second rotation position. Subsequently, the actual position of the rotation axis of the transportation mechanism is determined from the measurement values of the inclination sensor and from the angular differential between the rotation positions. The process according to the invention enables the determination of the actual position of the rotation axis through providing measurements in different rotation positions in a simple manner. Based on the determined actual position, the rotation axis can be easily adjusted, even in case a direct access to the rotation axis, like e.g. with enclosed transportation systems, is not possible.

According to a preferred embodiment of the invention, the transportation mechanism is turned at least into one other rotation position before determining its position and the inclination of the inclination sensor is measured in the other rotation position, thus providing three measurement values of the inclination sensor and two angular differentials between the respective rotation positions for the subsequent determination of the actual position. Hereby the precision of the determination of the actual position can be increased. Thereby the angular differential between any of the various rotation positions is preferably not equal 180°, in order to assure, in particular with inclination sensors having only one measurement axis, that measurements along different measurement directions can be performed.

In another embodiment of the invention, the inclination of the inclination sensor is measured before position determination in four different rotation positions in order to provide a respective number of measurement results of the inclination sensor for determining the actual position. Thereby the angular difference between adjacent rotation positions is preferably 90° or 180° in order to generate measurements along orthogonal measurement directions. When providing three or four measurements, measurement couples are being formed, providing a measurement along the same measurement direction, but on opposite sides of the rotation axis. Such measurement couples enable the determination of the actual position relative to earth gravity in a particularly simple manner, even in case the inclination sensors are not calibrated.

In a preferred embodiment of the invention, the at least one transportation arm mounted to the rotation element comprises at least two arms moveable relative to each other, whereby the arms are not being moved relative to each other at least between measurements in different rotation positions in order to assure that the inclination sensor is only influenced by a motion around the rotation axis of the rotation element whose actual position is to be determined.

In order not to interfere with the normal operation of the transportation mechanism and in order to allow the use of the inclination sensor for determining the actual position of different transportation mechanisms, the inclination sensor is preferably mounted to the transportation mechanism in a non permanent manner. Hereby the inclination sensor is preferably picked up by the transportation arm like a substrate, e.g. a semiconductor wafer, to be handled. Furthermore, the inclination sensor is automatically deposited by the transportation arm after the position has been determined. Thus, the determination process according to the invention can be performed in a substantially fully automatic manner.

In an especially preferred embodiment of the invention, an inclination sensor with two internal, different measurement axes, or two separate inclination sensors with measurement axes with different orientations, are used. Hereby the number of measurement values per rotation position can be increased which can provide for acceleration in performing the process. Hereby the measurement axes of the inclination sensor are preferably oriented orthogonal to each other.

In order to obtain opposed measurement pairs, thereby a first measurement value is obtained in the first rotation position along the first measurement direction and along a second measurement direction a second value is determined and in a second rotation position along the first measurement direction a third value is determined and along the second measurement direction a fourth value is determined, whereby the first and the second rotation positions are rotated by 180° relative to each other. Through the rotation positions rotated by 180° relative to each other it is assured that the measurement directions are aligned relative to each other, whereby opposed measurement results are obtained which allow in an especially simple manner the determination of the actual position of the rotation axis relative the earth gravity.

Furthermore according to the invention, a process is provided for aligning a transportation mechanism with at least one rotation element rotable around a rotation axis and at least one transportation arm mounted to the rotation element wherein initially the actual position of the rotation axis is determined in the above-described manner and thereafter the rotation axis is brought into a desired position. Through the employment of the above mentioned determination process for the actual position of the rotation axis an adjustment into a predetermined position can be accomplished in a simple manner. Thereby the desired position of the rotation axis in a preferred embodiment of the invention is reached through the generation of measurement couples wherein a first arithmetic mean from the first and the third measurement value is calculated and a second arithmetic mean from the second and the fourth measurement value is calculated.

Preferably, the rotation axis of the transportation mechanism is aligned with earth gravity, whereby the alignment is performed automatically. Thereby the rotation element of the transportation mechanism is preferably installed in a drive housing and the alignment of the rotation axis is performed through a change of position of the drive housing. Hereby an enclosed system for the rotation element can be provided and the rotation element does not have to be changed relative to its drive elements. Thus, the whole drive system including the rotation element is being aligned.

In a preferred embodiment of the invention, after the rotation axis of the rotation element has been brought into the desired position, the transportation arm is being aligned relative to the rotation axis. Hereby it shall be accomplished that, e.g., a wafer carrier surface on the transportation arm is aligned exactly horizontally. Thereby the alignment of the transportation arm is performed, e.g., through an additional rotation axis on the transportation arm.

The determination procedure according to the invention is also suitable in a advantageous manner for a process to exchange a transportation mechanism with at least one rotation element rotable around a rotation axis and with at least one transportation arm mounted to the rotation element, wherein initially the actual position of the rotation axis of the rotation element of the transportation mechanism to be exchanged is determined with the process according to the invention. Subsequently, the transportation mechanism to be exchanged is replaced with a new transportation mechanism with at least one rotation element rotatable around the rotation axis and with at least one transportation arm mounted to the rotation element and eventually the new transportation is being aligned, wherein initially the actual position of the rotation axis of the rotation element of the new transportation mechanism is determined in a manner according to the invention and subsequently brought into a desired position, wherein the desired position of the rotation axis of the new transportation mechanism equals the actual position of the rotation axis of the rotation element of the transportation mechanism to be replaced. Hereby it can be accomplished that the new transportation mechanism is aligned to the surrounding stations in the same manner as the old transportation mechanism, whereby a new alignment of the stations can be avoided.

Preferably, in the process according to the invention, a graphic display of the actual position and/or the desired position of the rotation axis relative to the reference axis is provided. Thereby the reference axis is preferably aligned with earth gravity since preferably an alignment with respect to earth gravity shall be performed.

Preferably, the measurement values from the inclination sensor are transferred to a unit for determining the actual position of the rotation axis in a wireless manner. Through wireless data transfer, use of cables that interfere with the process can be avoided. The measurement values are preferably transferred via a transmitter/receiver, which can receive the measurement instructions from a control unit and transfer them to an inclination sensor and transfer measurement values back to the control unit. Preferably at least the inclination sensor and the transmitter/receiver form a unit. In an embodiment of the invention the unit has an energy source and, after performing the determination process, a transportation mechanism transfers the unit, including the energy source, to a charging unit in order to charge the energy source and to prepare the unit for the next operation.

Preferably, the measurement data of the inclination sensor are stored electronically. An electronic memory can preferably be a part of the unit, wherein also the inclination sensor is located, which, e.g., makes an intermediate storage possible. The measurement data can then be transferred after the completion of all measurements. This can, e.g., be performed also without the use of a transmitter/receiver in the area of a receptacle, which, e.g., has read out contacts through which the memory can be read. The receptacle can have additional charging contacts to charge the energy source.

The method according to the invention is provided in particular for a transportation mechanism for transporting disc shaped substrates, in particular semiconductor wafers. Thereby the transportation mechanisms are preferably provided for loading a rapid heating chamber with semiconductor substrates.

The invention and the preferred embodiments become apparent in the Patent claims.

BRIEF DESCRIPTION OF THE DRAWINGS

Subsequently the invention is described in more detail according to a preferred embodiment with reference to the drawing; the drawings show.

DETAILED DESCRIPTION

Figure 1:
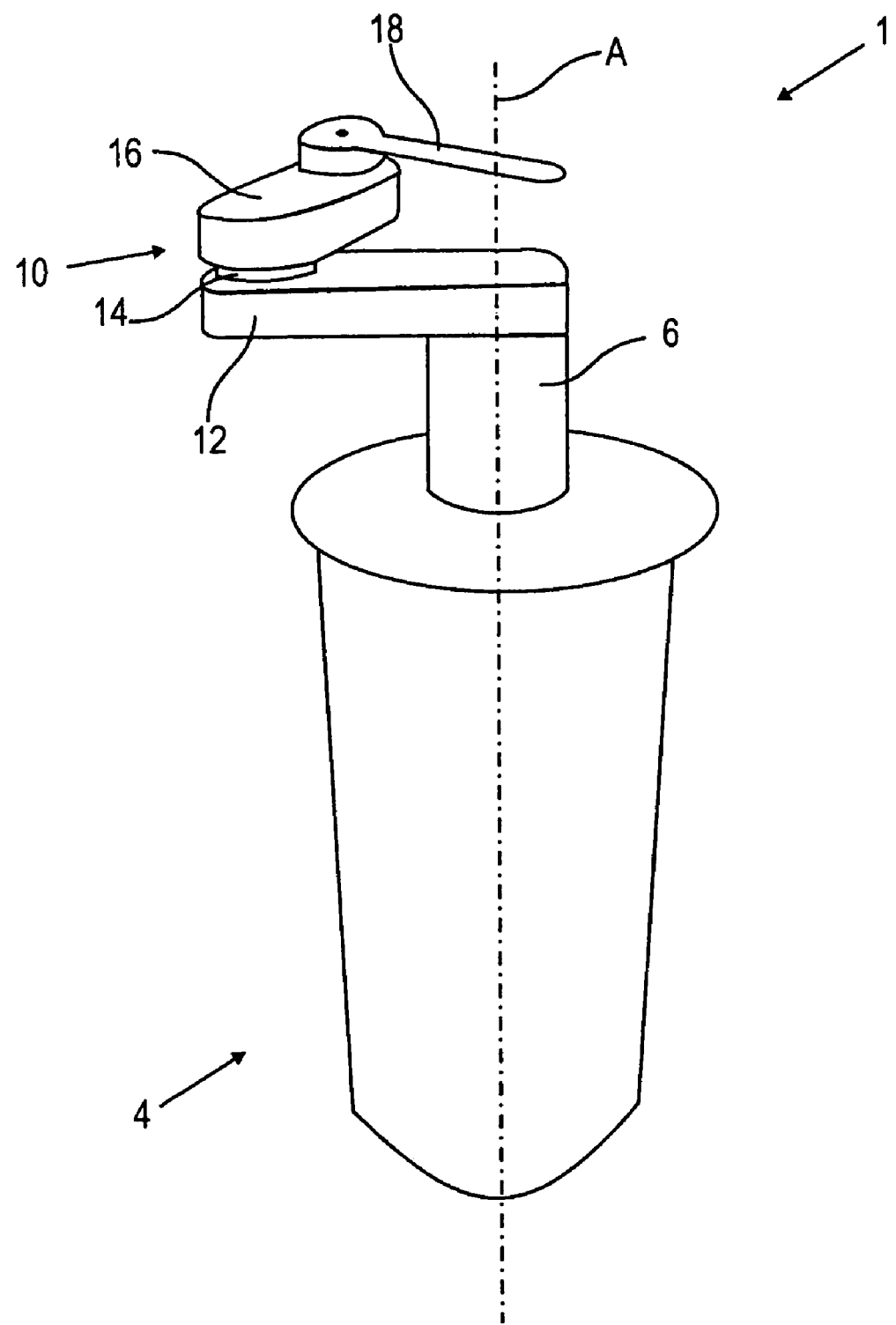
FIG. 1 is a schematic of a transportation mechanism.
Figure 2:
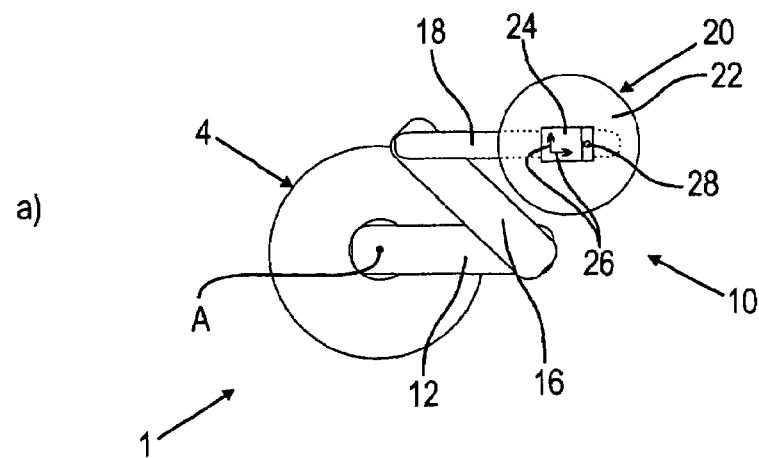
FIG. 2 at (a), (b) and (c) is a schematic of a transportation mechanism in different rotation positions.
Figure 2:
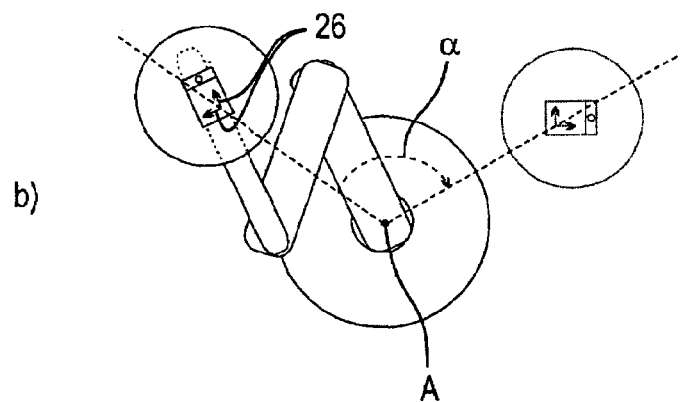
Figure 2:
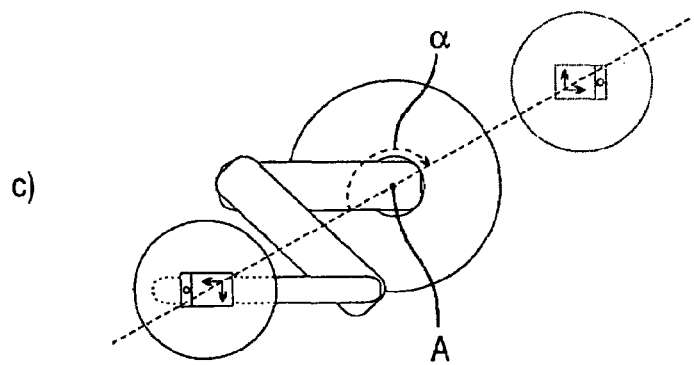

FIG. 1 and FIG. 2 at (a) show a schematic and a plan view, respectively, of a transportation mechanism 1 for transporting semiconductor substrates, in particular semiconductor wafers. The transportation mechanism 1 has a housing 4, wherein a lifting shaft 6 is at least partially contained. The lifting shaft 6 is moveable relative to the longitudinal direction of the housing 4 via a lifting device, which is not shown in detail. The lifting shaft is a hollow cylinder and receives a rotation shaft in its interior, which is not shown in detail and which can be rotated around a rotation axis A (z-axis). Instead of providing separate rotation and lifting shafts it is also possible to provide a combined rotation-/lifting shaft in the housing 4. The rotation shaft (which is not shown) engages a rotation drive in the housing 4. At the upper end of the rotation shaft a transport arm assembly 10 is provided. The transport arm assembly 10 is formed by a first arm 12, connected to the rotation shaft in a rotationally fixed manner, a rotation joint 14, a second arm 16 and a carrier arm 18. The first arm is connected with the rotation shaft at its first end in a rigid manner and has a rotation joint 14 at its second end. The rotation joint 14 connects the first and the second arm in a rotable manner, wherein a rotation between these two arms is performed through a drive (not shown in detail) which mostly serves to adjust the distance between the material to be transported and the rotation axis A. The rotation joint is connected with the second arm at one of its ends. At the other end of the second arm, the carrier arm 18 is mounted, wherein the carrier arm 18 in turn can be rotated relative to the second arm. A rotation between the second arm and the carrier arm is performed via a rotation device that is not shown in detail.

The transportation mechanism is suitable to transport semiconductor wafers between various positions, e.g. between a wafer receiving cassette and a RTP chamber. Hereby the carrier arm 18 moves under a respective wafer and is lifted through a motion of the lifting shaft 6 in order to lift the wafer off a respective carrier surface. Subsequently, the wafer resting on the carrier arm 18 is moved into a second position through the rotation of a rotation shaft, which is not shown, and though a motion of the arms 12, 16, and 18 relative to each other. Through a respective lowering of the lifting shaft the wafer can then be laid down on a respective carrier surface.

For a controlled laying down it is necessary that the transportation mechanism is aligned with the respective receiving stations for the semiconductor wafer. Hereby it is advantageous that the carrier surfaces of the respective stations form a horizontal support and that the carrier arm 18 is positioned horizontally in each rotation position of the rotation shaft. Hereby the rotation shaft 6 has to be aligned vertically.

In order to facilitate such an alignment, it is necessary to initially determine the actual position of the rotation shaft or of a rotation axis A of the rotation shaft.

Therefore, a measuring device 20 as can be seen in FIGS. 2 at (a) and 3 is provided.

The measuring device 20 comprises a disc shaped main body 22, which e.g. has the shape of a semiconductor wafer. In the middle of this main body an inclination sensor 24 is located, which is a two axis inclination sensor in the embodiment shown. In this respect, a two axis inclination sensor is an inclination sensor measuring inclination along two measurement axes, as shown through the arrows 26, symbolizing the measurement axes. In the currently preferred embodiment, the measurement axes are positioned orthogonal to each other. On the inclination sensor 24 a transmitter/receiver 28 is provided, which is capable of transferring the measurement signals to an external processor like, e.g., a PC 30, which can be seen in FIG. 3. For receiving signals and for issuing measuring instructions, the PC 30 has a respective transmitter-receiver 32. The PC 30 is connected with a display and/or control unit 34, like, e.g., a touch screen, in order to display the signals from the inclination sensor graphically and to enter instructions.

Figure 3:
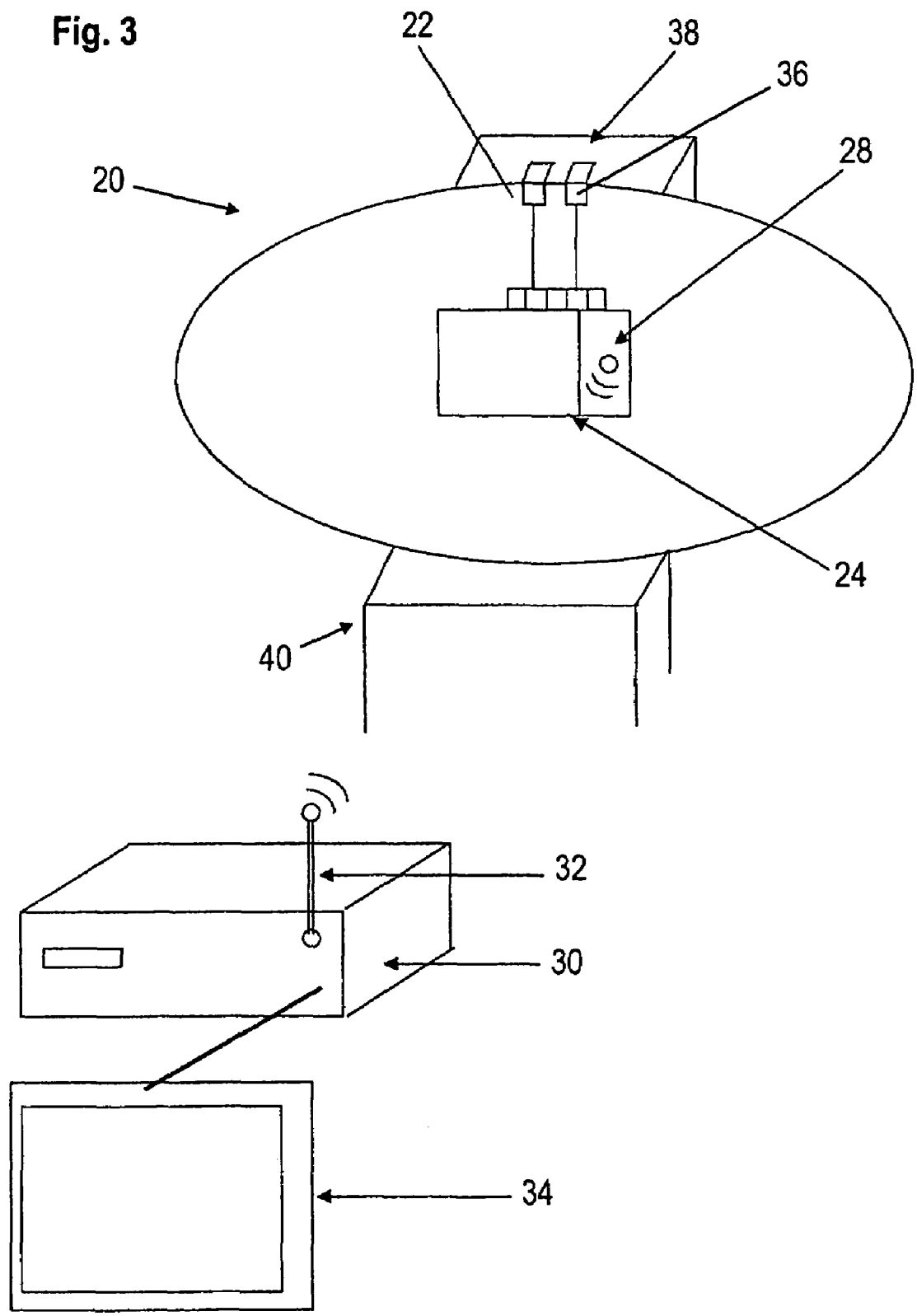
FIG. 3 is a schematic of a measurement device for performing the process according to the invention.

As shown in FIG. 3, contact elements 36 are located on the disc shaped substrate 20 to contact with contact elements 38 of a substrate carrier surface 40 in order to provide the inclination sensor 24 with energy. The inclination sensor 24 includes, for example, a rechargeable battery, which can be charged via contact elements 36 and 38.

The function of the measuring device 20 is explained subsequently with reference to FIG. 2 at a), b), and c).

The transportation mechanism 1 first picks up the measuring device 20 from the substrate carrier surface 40 through moving the carrier arm 18 under the disc shaped substrate 20 and lifting it. The motion of the transportation mechanism is controlled, e.g., by the PC 30. The transmitter/receiver 32 sends measuring instructions to the inclination sensor 24, which then measures the inclination along the two axes (x-axis and y-axis). Thereafter, the respective measurement values are transferred to the PC 30 via the transmitter-receiver 28 and the PC 30 stores the two measurement values as x1 and y1. Subsequently, the transportation mechanism 1 is rotated around the rotation axis A by the predetermined angle a e.g. 120° as shown in FIG. 2 at (b). In FIG. 2 at (b), the original measuring position is shown in dashed lines. The rotation angle can, e.g., be provided by the PC 30. During this rotation the respective elements of the transportation arm assembly are not being moved relative to each other.

The PC sends a second measurement instruction via the transmitter-receiver 32 to the inclination sensor 24, which in turn performs a measurement along the respective measurement axes. The measurement results in turn are transferred to the PC 30 via the transmitter-receiver 28. In the PC 30 the two measurement values are stored as x2 and y2. Based on the knowledge of the angular differential between the two rotation positions and the respective measurement values, the PC can now determine an actual position of the rotation axis A.

Through the above method, the actual position of the rotation axis A can be easily determined. Thereby, the rotation angle or angular separation a between the two measuring points can be chosen at will, wherein preferably a rotation angle of at least 10° is applied. When using a two axes inclination sensor with measurement axes positioned orthogonal to each other, in particular a rotation by 180° is advantageous as shown in FIG. 2 at (c). A comparison of the resulting values x1 and x2 and y1 and y2 makes a position determination easy, since the measurements are performed along the same axis but in different directions. If both value pairs are identical the rotation axis A is vertical, this means aligned with earth gravity.

In case both value pairs are not identical, the actual position of the rotation axis A can be easily determined through the differential. Furthermore, even with non-calibrated inclination sensors, a vertical reference axis (this means a reference axis aligned with earth gravity) can be determined according to the following rules:

$$x_E = (x1+x2)/2; \text{ and}$$

$$y_E = (y1+y2)/2$$

wherein $x_E$ and $y_E$ stand for respective values along the x- and y-axis aligned with earth gravity. These values can then be transferred to the display and/or control unit 34 so that the actual position of the rotation axis A with reference to vertical can be displayed. This display enables a service technician to align the rotation axis in a desired position, which typically coincides with the vertical. The alignment, however, can also be performed fully automatically after the determination of the actual position.

After the alignment, the measurement procedure can be repeated in order to assure that the alignment was successful. After the alignment of the rotation axis A, the transport arm assembly 10 can be aligned relative to the rotation axis A, e.g., to align the carrier arm 18 horizontally.

After completing the determination of the actual position, the transportation mechanism 1 deposits the measuring device 20 on the substrate carrier surface 40 again, wherein the contact elements 36 on the disc shaped substrate 20 and the contact elements 38 on the substrate carrier surface 40 are brought into contact in order to enable a charging of the internal power supply of the inclination sensor.

In the shown embodiment of the invention an inclination sensor is provided which can be picked up by the transportation mechanism and can be put down again after performing the process according to the invention. However, it is also possible to mount the inclination sensor to the transportation mechanism in a solid manner like e.g. through bolting or gluing or through any other means of integrating the inclination sensor into the transportation mechanism. Hereby a picking up and depositing of the sensor can be dispensed with.

Independent from the inclination sensor being mounted to the transportation mechanism in a solid manner, or picked up and put down by it, the process according to the invention for determining the actual position of the rotation axis A of the transportation mechanism can be integrated into an automatic process in order to enable a regular control of the actual position during the life of the transportation mechanism. The actual position can change through wear of bearing parts or through unexpected events (e.g. a collision of the transportation mechanism with a foreign object). The process according to the invention then enables a new determination of the actual position in a simple and reliable manner. The determination can be performed, e.g., at predetermined times or immediately after the occurrence of an unexpected event like, e.g., a collision. The determined actual position can be used for aligning the rotation axis with gravity. Alternatively, it is also possible when exchanging a transportation mechanism of an existing system to align the rotation axis of a new transportation mechanism in a manner that it coincides with the rotation axis of the replaced transportation mechanism.

Figure 4:
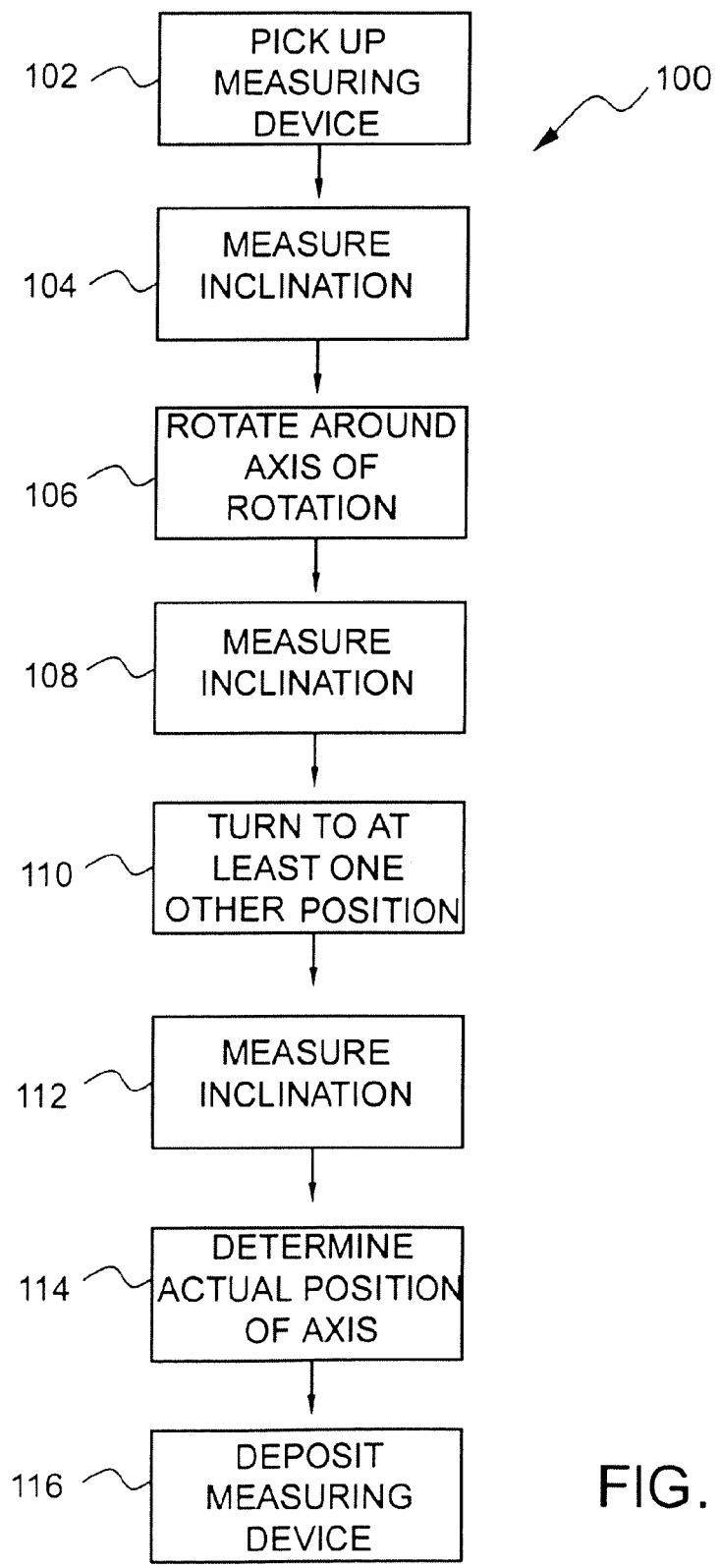
FIG. 4 is a flowchart illustrating steps in an example of a process for determining the actual position of a rotation axis of a transportation mechanism relative to a reference axis.

FIG. 4 is a flowchart illustrating steps in an exemplary process 100 for determining the actual position of a rotation axis of a transportation mechanism relative to a reference axis. At step 102, the measuring device is picked up from a holding location. At step 104, the sensor measures the inclination. At step 106, the mechanism is rotated around the rotation axis by a predetermined angle. At step 108, the inclination is measured again. At step 110, the mechanism is rotated to at least one other position, and at step 112, the inclination is measured again. At step 114, the actual position of the axis is determined based on the angular differential between the rotation positions and the respective inclination measurement values. At step 116, the measurement device is deposited, such as at the original holding location for example.

The invention was previously described in more detail with reference to a preferred embodiment and with reference to the drawings. The invention however is not limited to the actual described embodiment. In particular any angle can be selected between the different measurement positions. Also, the process according to the invention can be performed with a different transportation mechanism in particular with a transportation mechanism with a different transportation arm assembly. The process according to the invention can be advantageously used, in particular, in other areas of application or processes than the ones described here. The described embodiments of the invention can be additionally modified by elements and features resulting from a combination of elements and features of the shown embodiment or through the exchange of elements and features of the shown embodiments with other elements and features.

These and other modifications and variations to the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention.

This application incorporates by reference German Patent Application No. 10 2005 035 199.9, filed Jul. 27, 2005, in its entirety for all purposes.

What is claimed is:

1. A process for determining the actual position of a rotation axis of a transportation mechanism relative to a reference axis, the process comprising:

measuring the inclination of at least one inclination sensor supported by the transportation mechanism along at least one measurement axis when the transportation mechanism is positioned in a first rotation position;

rotating the transportation mechanism around the rotation axis into a second rotation position and measuring the inclination of the at least one inclination sensor along the at least one measurement axis in the second rotation position; and determining the actual position of the rotation axis from the measurement values of the inclination sensor and from the angular separation between the rotation positions.

2. The process as set forth in claim 1, wherein that the angular separation between any of the different rotation positions at which the inclination is measured is not equal to 180 degrees.

3. The process as set forth in claim 1, wherein the angular differential between adjacent rotation positions is 90 or 180 degrees.

4. The process as set forth in claim 1, wherein the transportation mechanism comprises at least two arms moveable relative to each other; and wherein the arms are not moved relative to each other between measurements in different rotation positions.

5. The process as set forth in claim 1, further comprising:

after determining the actual position of the rotation axis of the transportation mechanism, replacing the transportation mechanism with a new transportation mechanism having at least one rotation element rotable around a rotation axis and at least one transportation arm mounted to the rotation element; and determining the actual position of the rotation axis of the new transportation mechanism and aligning said axis by bringing it into a desired position;

wherein the desired position of the axis of the new transportation mechanism coincides with the actual position of the rotation axis of the rotation element of the transportation mechanism that was replaced.

6. The process as set forth in claim 1, further comprising:

graphically displaying the actual position and/or the desired position of the rotation axis relative to the reference axis.

7. The process as set forth in claim 1, wherein the reference axis is aligned with gravity.

8. The process as set forth in claim 1, wherein the measurement values of the inclination sensor are stored electronically.

9. The process as set forth in claim 1, further comprising:

rotating the transportation mechanism into at least one additional rotation position and measuring the inclination of the at least one inclination sensor before determining the actual position of the rotation axis.

10. The process as set forth in claim 9, wherein the inclination of the inclination sensor is measured at four different rotation positions.

11. The process as set forth in claim 1, wherein the inclination sensor is removably supported by the transportation mechanism.

12. The process as set forth in claim 11, further comprising:

using the transportation arm to automatically pick up the inclination sensor prior to the first inclination measurement.

13. The process as set forth in claim 11, further comprising:

using the transportation arm to automatically put down the inclination sensor after the final inclination measurement.

14. The process as set forth in claim 1, wherein measuring the inclination comprises measuring the inclination along at least two different measurement axes.

15. The process as set forth in claim 14, wherein the measurement axes are orthogonal to each other.

16. The process as set forth in claim 14, wherein a first inclination value is determined along a first measurement axis and a second inclination value is determined along a second measurement axis while the transportation mechanism is in the first rotation position; and a third inclination value is determined along the first measurement axis and a fourth inclination value is determined along the second measurement axis after the transportation mechanism is rotated into the second rotation position;

wherein the angular separation between the first and the second rotation position is 180 degrees.

17. The process as set forth in claim 1, wherein the measurement values are transferred using a wireless transmitter-receiver from each inclination sensor to a unit for determining the actual position of the rotation axis.

18. The process as set forth in claim 17, wherein the at least one inclination sensor and the wireless transmitter-receiver comprise a calibration unit.

19. The process as set forth in claim 18, wherein the calibration unit further comprises a source of energy; and the transportation mechanism transfers the unit to a charging station after the final inclination measurement.

20. The process as set forth in claim 18, wherein the transportation mechanism is configured to support disc shaped substrates; and the inclination sensor, wireless transmitter-receiver, and energy source are configured into a unit having substantially the same shape as a disc-shaped substrate.

21. The process as set forth in claim 1, wherein the transportation mechanism comprises a rotation element rotatable about the rotation axis and;

the process further comprises aligning the rotation axis by bringing the axis into a desired position based on the determined actual position of the axis.

22. The process as set forth in claim 21, wherein:

measuring the inclination comprises inclination measurements along at least two different measurement axes;

a first inclination value is determined along a first measurement axis and a second inclination value is determined along a second measurement axis while the transportation mechanism is in the first rotation position; and a third inclination value is determined along the first measurement axis and a fourth inclination value is determined along the second measurement axis after the transportation mechanism is rotated into the second rotation position; and wherein the desired position of the rotation axis is determined through calculating a first arithmetic mean from the first and the third measurement value and a second arithmetic mean from the second and the fourth measurement value.

23. The process as set forth in claim 21 wherein the desired position for aligning the rotation axis of the transportation mechanism is alignment with earth gravity.

24. The process as set forth in claim 21, wherein the rotation axis is automatically brought into the desired position.

25. The process as set forth in claim 21, wherein the transportation mechanism comprises at least one transportation arm mounted to the rotation element; and wherein the process further comprises aligning the transportation arm relative to the rotation axis after the rotation axis of the rotation element has been brought into the desired position.

26. The process as set forth in claim 21, wherein the rotation element of the transportation mechanism is mounted in a drive housing and the alignment of the rotation axis is performed by a change of position of the drive housing.

* * * * *

UNITED STATES PATENT AND TRADEMARK OFFICE
CERTIFICATE OF CORRECTION

Figure 5:
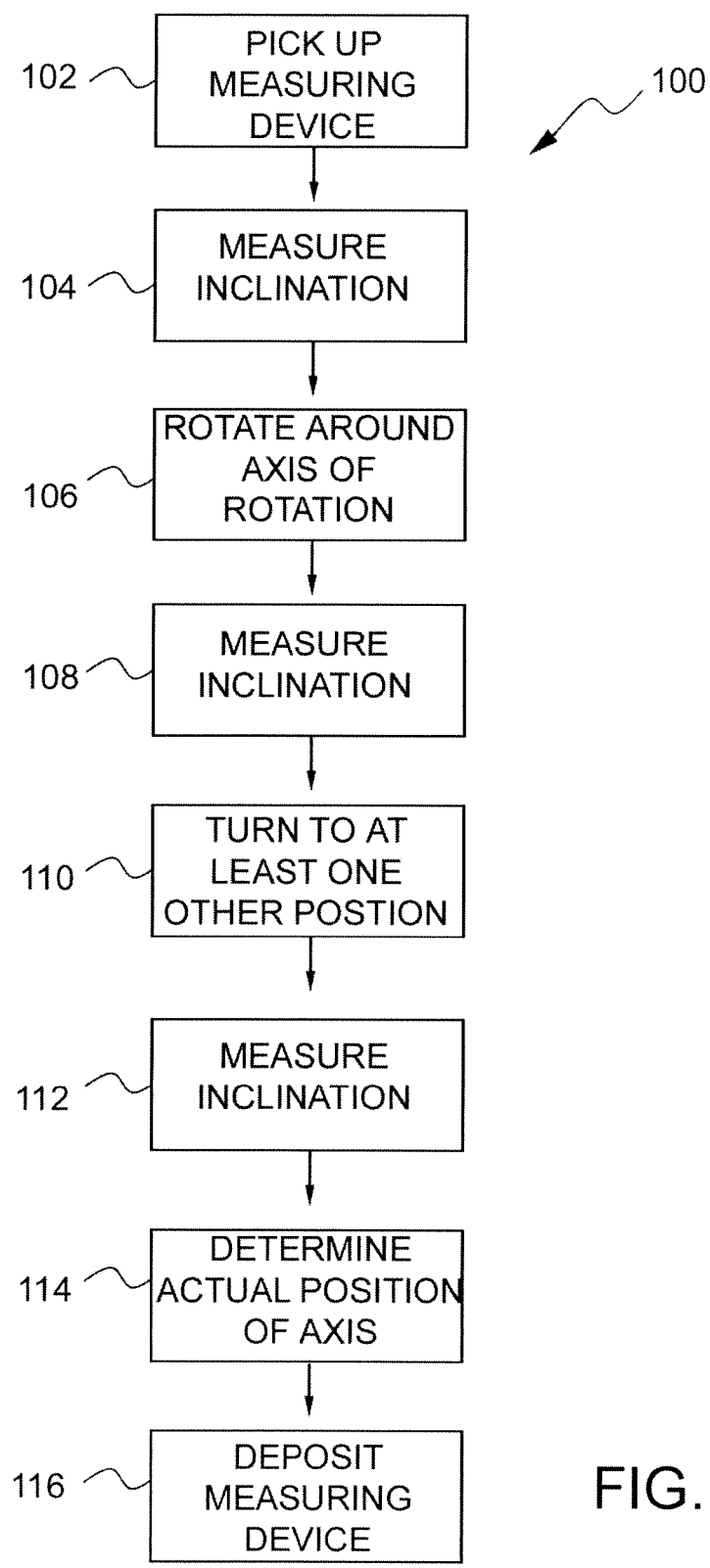
Figure 1:
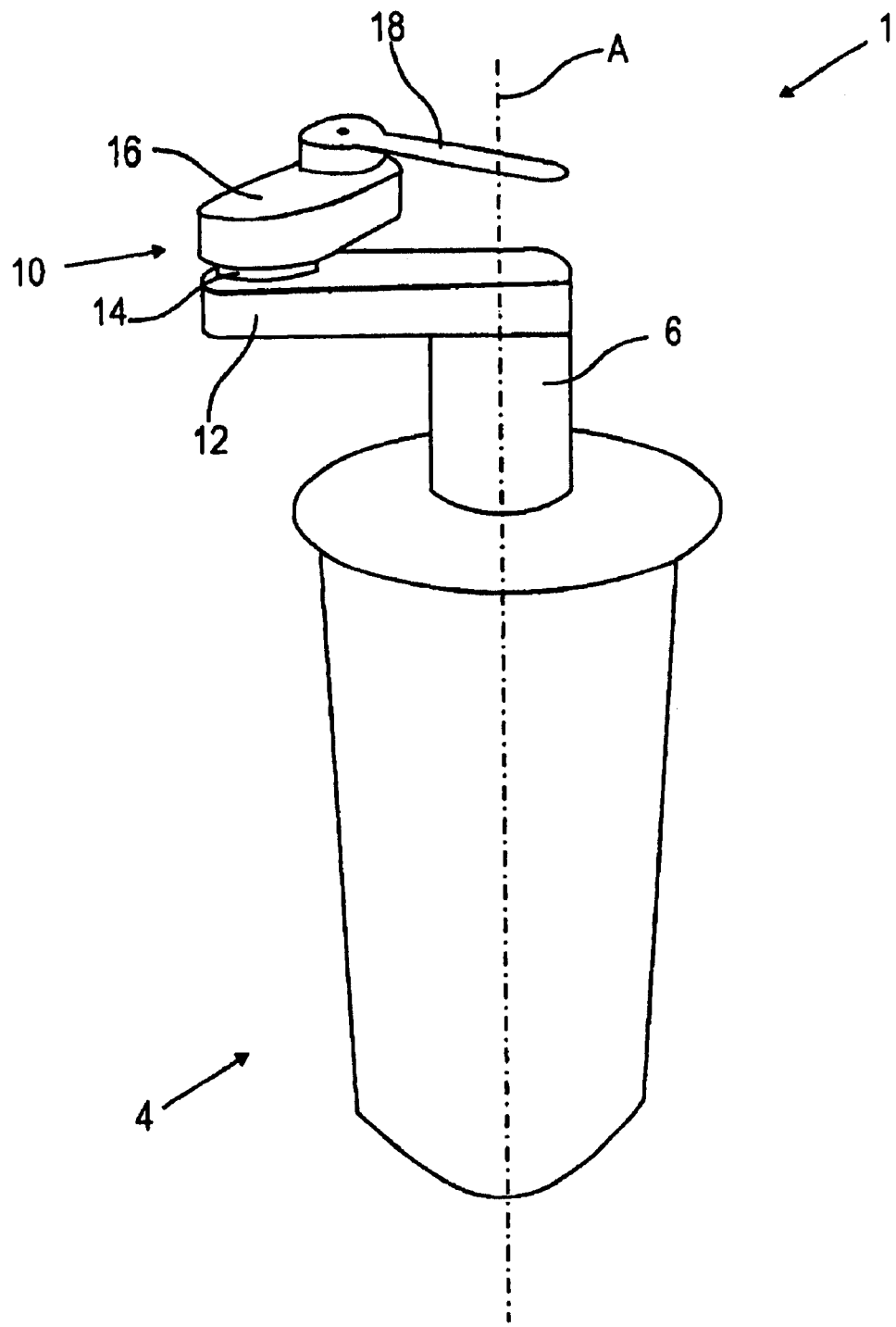
Figure 2:
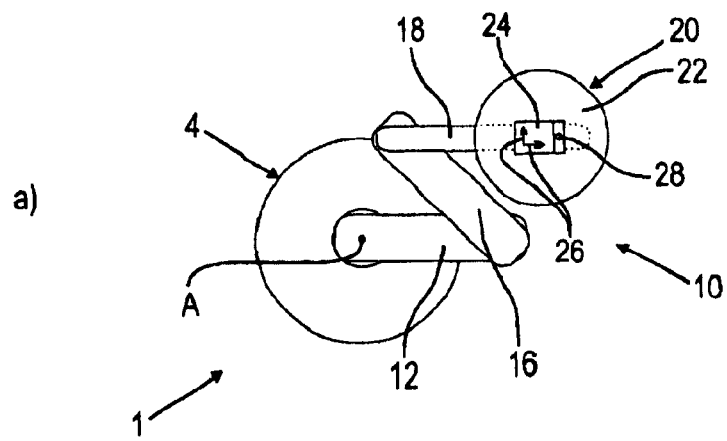
Figure 2:
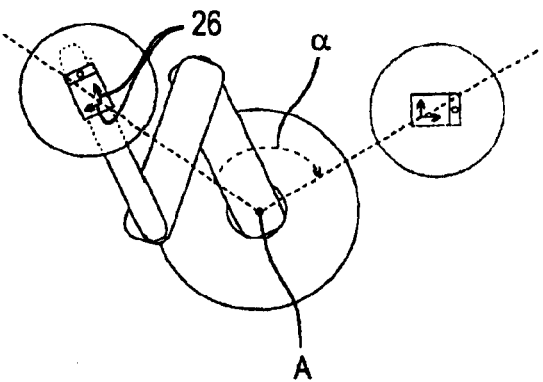
Figure 2:
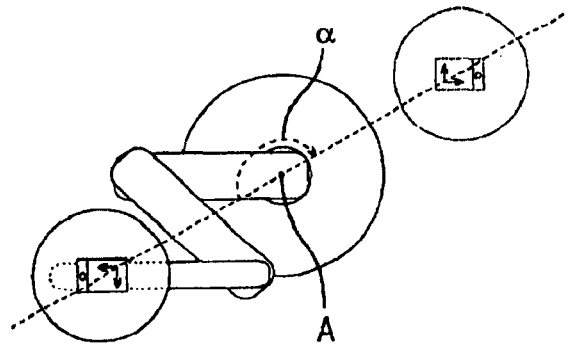
Figure 3:
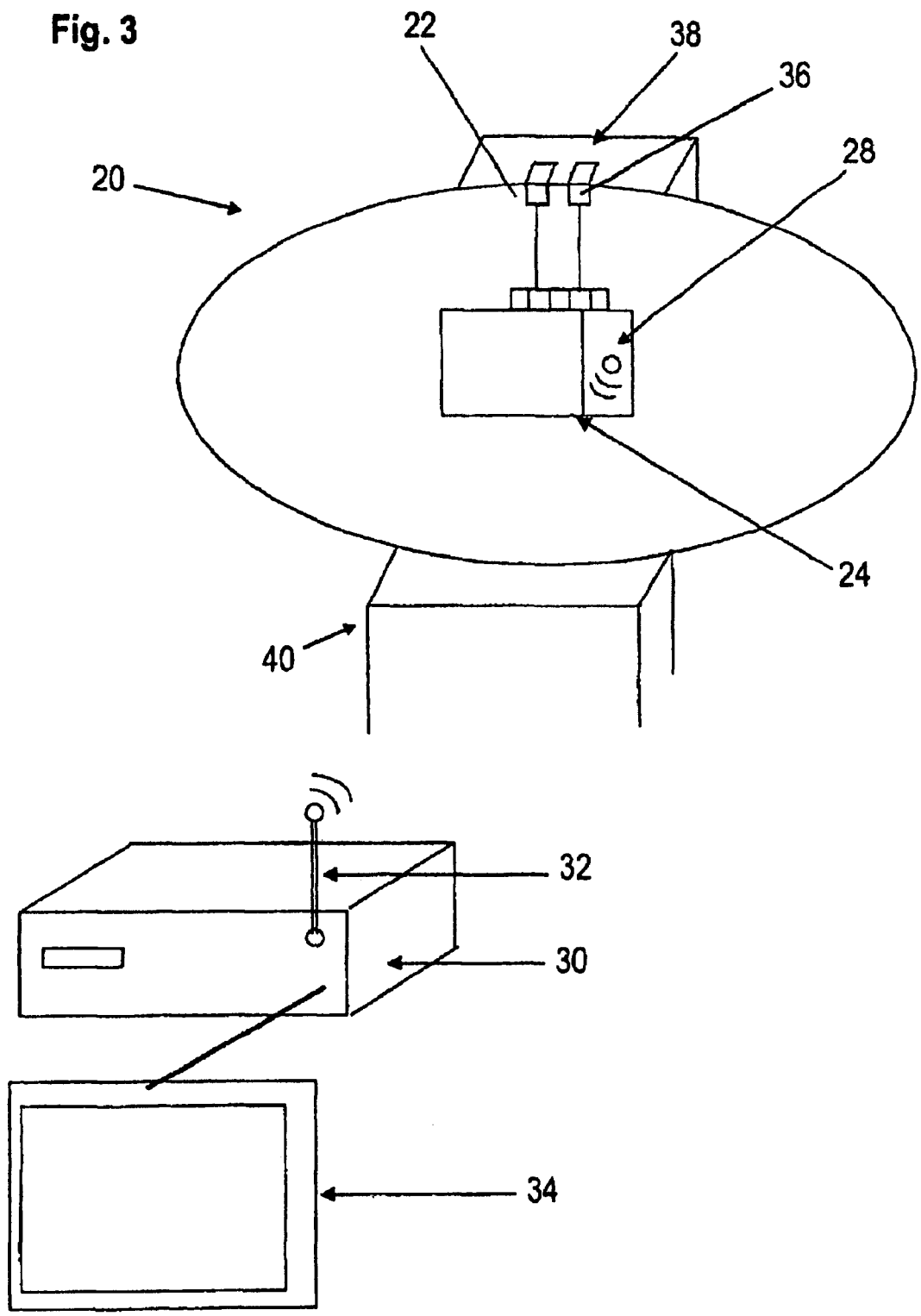
Figure 4:
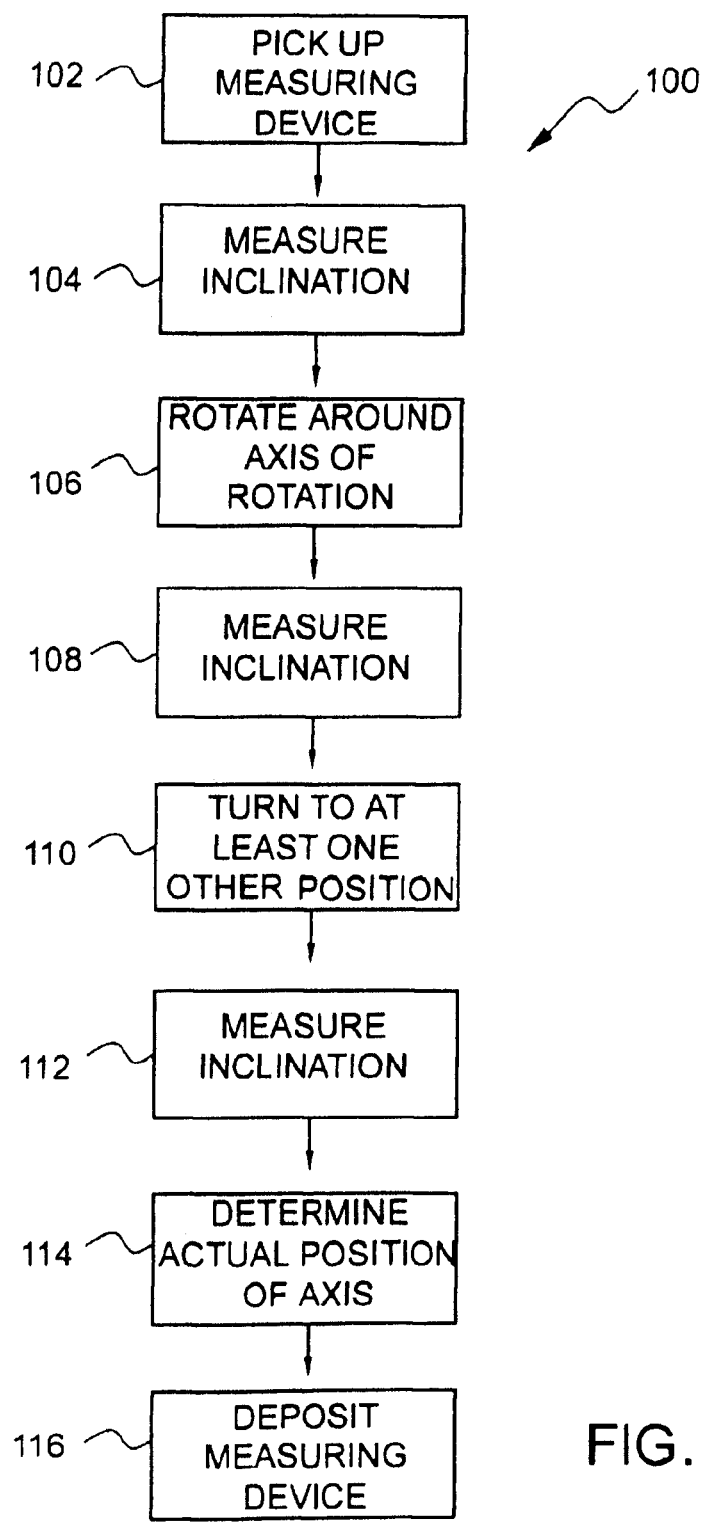

PATENT NO. : 7,493,231 B2  Page 1 of 1
APPLICATION NO. : 11/491477
DATED : February 17, 2009
INVENTOR(S) : Ottmar Graf It is certified that error appears in the above-identified patent and that said Letters Patent is hereby corrected as shown below:

In the Drawings delete figure 5.

Signed and Sealed this

Seventeenth Day of August, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,493,231 B2 | |
| APPLICATION NO. | : 11/491477 | |
| DATED | : February 17, 2009 | |
| INVENTOR(S) | : Ottmar Graf | |

It is certified that error appears in the above-identified patent and that said Letters Patent is hereby corrected as shown below:

Delete title page and substitute therefore the attached title page showing the corrected number of drawing sheets in patent.

Delete Drawing Sheets 1-5 and substitute therefore the attached Drawing Sheets 1-4.

This certificate supersedes the Certificate of Correction issued August 17, 2010.

Signed and Sealed this

Fourteenth Day of September, 2010

David J. Kappos
*Director of the United States Patent and Trademark Office*

United States Patent
Graf

(12) United States Patent
Graf

(10) Patent No.: US 7,493,231 B2
(45) Date of Patent: Feb. 17, 2009

(54) PROCESS FOR DETERMINING THE ACTUAL POSITION OF A ROTATION AXIS OF A TRANSPORTATION MECHANISM

(76) Inventor: Ottmar Graf, Ravensburger Strasse 38, Bergatreute, 88368 (DE)

(*) Notice: Subject to any disclaimer, the term of this patent is extended or adjusted under 35 U.S.C. 154(b) by 0 days.

(21) Appl. No.: 11/491,477

(22) Filed: Jul. 21, 2006

(65) Prior Publication Data
US 2007/0150226 A1 Jun. 28, 2007

(30) Foreign Application Priority Data
Jul. 27, 2005 (DE) .................. 10 2005 035 199

(51) Int. Cl.
*G01C 9/00* (2006.01)
*G06F 19/00* (2006.01)

(52) U.S. Cl. ............ 702/151; 33/1 R; 33/1 N; 33/1 PT; 33/501; 33/520; 33/568; 33/573; 73/1.01; 73/1.75; 73/1.79; 702/85; 702/92; 702/94; 702/150; 702/154; 702/189

(58) Field of Classification Search ......... 33/1 R, 33/1 N, 1 PT, 501, 520, 534, 568, 573; 73/1.01, 73/1.75, 1.79; 702/85, 92, 94, 105, 127, 702/150, 151, 154, 155, 157, 189
See application file for complete search history.

(56) References Cited

U.S. PATENT DOCUMENTS

| 4,011,659 | A | * | 3/1977 | Horvallius | 33/203 |
| 5,261,279 | A | * | 11/1993 | Wolf et al. | 361/280 |
| 5,359,693 | A | * | 10/1994 | Nenyei et al. | 392/418 |
| 5,580,830 | A | * | 12/1996 | Nenyei et al. | 438/795 |
| 5,822,213 | A | * | 10/1998 | Huynh | 700/213 |
| 5,825,913 | A | * | 10/1998 | Rostami et al. | 382/151 |
| 6,038,524 | A | * | 3/2000 | Leger et al. | 702/151 |

(Continued)

FOREIGN PATENT DOCUMENTS

WO   WO 0196836 A1   12/2001

(Continued)

OTHER PUBLICATIONS

International Search Report—3 pages, Dated Oct. 5, 2007.

(Continued)

*Primary Examiner*—Edward R Cosimano
(74) *Attorney, Agent, or Firm*—Dority & Manning, P.A.

(57) ABSTRACT

Determination of the actual position of the rotation axis of a transportation mechanism relative to a reference axis, in particular relative to gravity, is performed with at least one inclination sensor mounted to the transportation mechanism having at least one measurement axis, and comprises the measurement of the inclination of at least the one inclination sensor along the at least one measurement axis in a first rotation position of the transportation mechanism, and the measurement of the inclination of the at least one inclination sensor along the at least one measurement axis in a second rotation position. The actual position of the rotation axis of the transportation mechanism may be determined from the measurement values of the inclination sensor and the angular separation between the rotation positions. The process is suitable in particular for a process to align the rotation axis of a transportation mechanism and for a process for replacing a transportation mechanism.

26 Claims, 4 Drawing Sheets

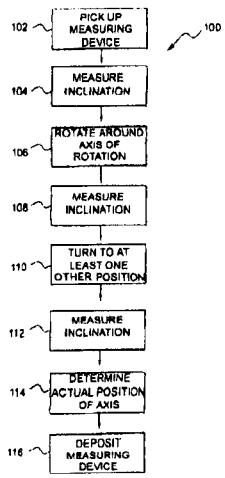

a)

b)

c)